(12) United States Patent
Eason et al.

(10) Patent No.: US 7,070,702 B1
(45) Date of Patent: Jul. 4, 2006

(54) PATTERN FORMATION METHOD USING LIGHT-INDUCED SUPPRESSION OF ETCHING

(75) Inventors: Robert W Eason, Southampton (GB); Ian E Barry, Southampton (GB); Peter G R Smith, Southampton (GB); Graeme W Ross, Southampton (GB)

(73) Assignee: QinetiQ Limited, London (GB)

( * ) Notice: Subject to any disclaimer, the term of this patent is extended or adjusted under 35 U.S.C. 154(b) by 892 days.

(21) Appl. No.: 09/743,966

(22) PCT Filed: Jul. 20, 1999

(86) PCT No.: PCT/GB99/02331

§ 371 (c)(1),
(2), (4) Date: Jan. 18, 2001

(87) PCT Pub. No.: WO00/07231

PCT Pub. Date: Feb. 10, 2000

(30) Foreign Application Priority Data

Jul. 25, 1998 (GB) .................................. 9816168.0

(51) Int. Cl.
*B44C 1/22* (2006.01)

(52) U.S. Cl. ............................ 216/87; 216/65; 216/85; 438/745

(58) Field of Classification Search .................. 216/17, 216/22, 31, 65, 87, 94, 85; 438/745, 750
See application file for complete search history.

(56) References Cited

U.S. PATENT DOCUMENTS

| 4,349,583 | A | * | 9/1982 | Kulynych et al. | .......... 427/53.1 |
| 4,661,201 | A | * | 4/1987 | Petridis et al. | ............... 156/345 |
| 5,315,432 | A | * | 5/1994 | Ohno | .......................... 359/326 |
| 5,431,766 | A | * | 7/1995 | Propst et al. | ................ 156/345 |
| 5,485,540 | A | * | 1/1996 | Eda | ............................. 385/129 |
| 5,523,256 | A | | 6/1996 | Adachi et al. | |
| 5,756,146 | A | * | 5/1998 | Lee et al. | ...................... 427/10 |

OTHER PUBLICATIONS

Alexander Khudobenko, "Fabrication od submicron relief grating in p-GaAs in the process of maskless holographic wet etching by laser-induced etch rate reduction method", Laser-Induced thin film processing, Feb. 1995, vol. 2403, pp. 409-413.*

(Continued)

*Primary Examiner*—Lan Vinh
(74) *Attorney, Agent, or Firm*—Nixon & Vanderhye P.C.

(57) ABSTRACT

A method of selectively etching a substrate (1) comprises applying etchant (4) at a surface of the substrate and illuminating an area of the surface with light from a light source (7), whereby etching is at least partially inhibited in the illuminated area (18) of the substrate. Preferably $LiNbO_3$ is patterned in HF KOH, or HF=$HNO_3$ solutions by selective illumination using UV laser light with 300 to 1000 mn wavelength, thereby allowing for interferometric or holographic structures to be formed.

13 Claims, 5 Drawing Sheets

OTHER PUBLICATIONS

Khudobenko A I et al.: "Fabrication of submicron relief gratings in p-GaAs in the process of maskless holographic wet etching by laser-induced etch rate reduction method" Laser-Induced Thin Film Processing, San Jose, CA, USA, vol. 2403, Feb. 1995, pp. 409-413, Proceedings of the SPIE-The International Society for Optical Engineering, USA.

Ross G W et al.: "Optical control of electric field poling in LiTa03" Aplied Physics Letters, vol. 71, No. 3, Jul. 1997, pp. 309-311.

Patent Abstracts of Japan vol. 1997, No. 02, Feb. 1997 & JP08 278625 (Toppan Printing Co Ltd), Oct. 1996.

Barry I E et al.: "Light-induced frustration of etching in Fe-doped LiNb03" Applied Surface Science, Elsevier, Netherlands, vol. 143, No. 1-4, Apr. 1999, pp. 328-331.

* cited by examiner

PATTERN FORMATION METHOD USING LIGHT-INDUCED SUPPRESSION OF ETCHING

BACKGROUND OF THE INVENTION

1. Field of the Invention

This invention relates to a method of selectively etching a substrate.

This application is the US national phase of international application PCT/GB99/02331, filed in English on Jul. 20, 1999 which designated the US. PCT/GB99/02331 claims priority to GB Application No. 9816168.0 filed Jul. 25, 1998. The entire contents of these application are incorporated herein by reference.

2. Discussion of Prior Art

There are many methods of etching which are known. One example of substrate etching is for fabrication of porous silicon by photoelectrochemically etching patterned n-type silicon wafers. A standard KOH etchant is used to form pits with sharp points on the wafer surface and by back illumination of the silicon with above band-gap light, photogenerated holes concentrate at the points where localised dissolution takes place by anodic etching in HF.

Another example is etching of trench formations in n-type GaAs, also using HF as the etchant, for which the etch rate is improved by illumination with UV light. Etching of lithium niobate ($LiNbO_3$) using ion driven techniques tends to be slow, so laser driven processes have been proposed where KF is applied to the surface of the $LiNbO_3$ and a pulsed high power density laser beam locally melts the $LiNbO_3$ which reacts with the KF to form a water soluble section which leaves a hole when rinsed. Increasing the power of the laser, increases the depth of the resultant hole.

All of the methods described aim to improve the rate of etching or depth of an etch by the use of illumination in combination with particular etchants or materials. This is an acceptable method for forming trenches, but less suitable for creating more complex structures in the substrate, which could only be done by setting up an etch pattern and relying on the areas that are not etched having the desired shape. Conventional etching of trenches also produces inclined sides with a reduced volume towards the bottom of the trench, so it is difficult to control the shape of a complex structure.

In SPIE Vol 2403 pp 409 to 412, Khudobenko describes fabrication of submicron gratings in p-GaAs where illumination of the sample surface diminishes the etching rate at that spot.

Applied Physics Letters, vol 71, No. 3, pp309 to 311 (21 Jul. 1997) by Ross et al. describes optically inducing periodic domain-inverted structures in bulk $LiTaO_3$ by simultaneous application of an electric field and UV wavelength illumination.

SUMMARY OF THE INVENTION

In accordance with the present invention, a method of selectively etching a substrate comprises applying etchant at a surface of the substrate; and illuminating an area of the surface with light from a light source, characterised in that the light is transmitted through the substrate, such that etching is at least partially inhibited in the illuminated area of the substrate.

The present invention enables selective etching by illuminating an area of substrate by transmitting light through the substrate and inhibiting etching in that area. This contrasts favourably with the conventional methods allowing more precision and control of the resulting shape of the etched substrate. This is also useful where a holographic image is projected onto the surface because the hologram can be positioned close to the substrate and remote from the etchant.

Preferably, the etching is substantially inhibited at the centre of the illuminated area. The degree of inhibition is dependent on the intensity of the illumination, so that at the centre of a spot illumination, there is substantially no etching, but further out a limited amount of etching takes place.

To modify the performance of the method, preferably an electrical field is applied across the substrate and etchant. This may affect both the light threshold required to inhibit etching and the rate at which etching is inhibited.

Preferably, the substrate comprises a material whose electrical properties are modified under the influence of light.

Where the light creates charge in the substrate, then concentration of released charge in the substrate assists inhibition of etching. Any material incorporating an additive or impurity which can release charge may be used, but preferably, the material comprises one of glass, ferroelectric or other crystal, ceramic, semiconductor or polymer.

Preferably, the substrate comprises Fe doped $LiNbO_3$, although other materials and other dopants may be used.

Preferably, the etchant comprises one of hydrogen fluoride (HF), potassium hydroxide (KOH) and 2:1 hydrofluoric acid and nitric acid (HF: $HNO_3$).

A pulsed light source may be used, but preferably the light comprises cw laser light.

Preferably, the light has a wavelength longer than the wavelength corresponding to the band-gap of the material.

For Fe doped $LiNbO_3$, preferably the wavelength is in the range 300 nm to 1000 nm.

In one embodiment, the method further comprises translating the image plane of the illuminated area of the substrate.

Preferably, the method further comprises projecting an interferometric or holographic 3-dimensional image onto the surface, such that the etched substrate embodies the structure of the image.

Preferably, the wavelength of the light is tuned to the absorption wavelength of the material. This allows control of absorption depth and hence strength of inhibition.

BRIEF DESCRIPTION OF THE DRAWINGS

An example of a method of selectively etching a substrate in accordance with the present invention will now be described with reference to the accompanying drawings in which:—

DETAILED DISCUSSION F EMBODIMENTS

Figure 1:
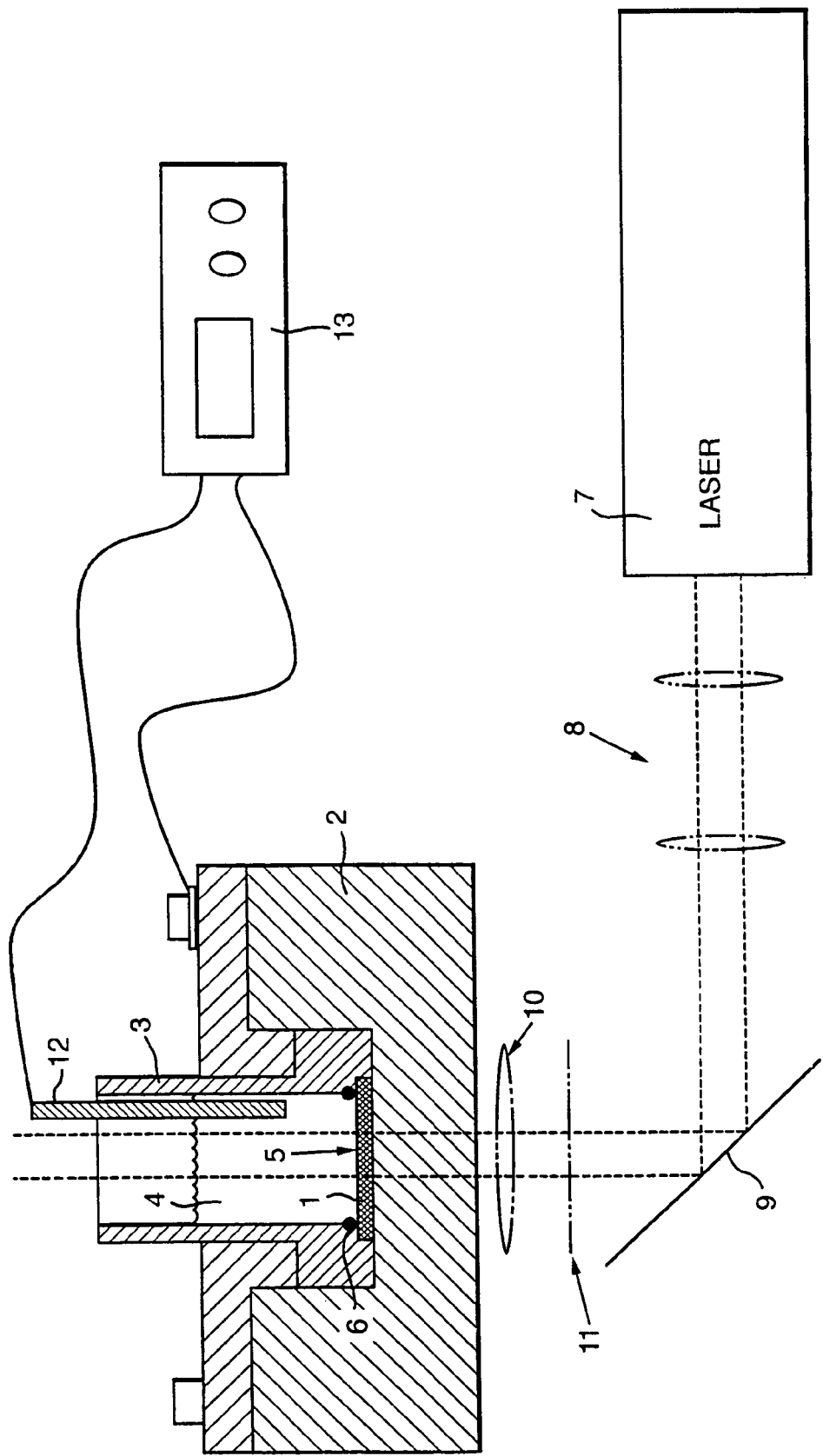
FIG. 1 is a schematic view of apparatus for carrying out the method of the present invention.

An example of apparatus for carrying out the method of the present invention is illustrated in FIG. 1. A sample substrate 1 is mounted at the bottom of a stainless steel cell 2 with a PTFE lining 3 containing etchant 4 coupled to an uppermost surface 5 of the substrate 1 via an o-ring seal 6. A wavelength tuneable, air-cooled, argon ion laser 7 is shone through a beam expanding telescope 8, reflected off a mirror 9 and focused by a lens 10 or passed through a mask 11 and image relayed onto the uppermost surface 5 of the substrate. Optionally, a platinum electrode 12 is inserted into the etchant 4 and driven by a power supply 13 to produce an electric field across the etchant and substrate. Application of an external electric field to bias the material modifies the etch behaviour and is relevant for producing three dimensional structures by changing polarity or field strength.

The substrate 1 used in this example was $LiNbO_3$ doped with 0.02 wt % Fe, 10 mm square and 500 µm or 1 mm thick arranged such that light was transmitted in a positive gain direction and the etchant 4 comprised $HF:HNO_3$ made up as 1 part aqueous HF and 2 parts nitric acid. Examples of $LiNbO_3$ doped with 0.04 and 0.2 wt % Fe where also tested. A suitable alternative material is doped $LiTaO_3$. Illumination was provided by the laser 7 operating at a wavelength of 488 nm with an output of 90 mW at source, producing powers of between 40 mW and 60 mW in the etchant 4. The laser wavelength used takes into account the wavelength likely to interact with the etchant, be transmitted by the substrate and interact photorefractively with the crystal structure of the substrate 1. The wavelength needs to be longer than the band-gap of the material, so it can penetrate the substrate sufficiently. Suitable wavelengths for Fe doped $LiNbO_3$ are in a range between its absorption cut-off wavelength of ~330 nm, and up to any wavelength at which the light can still activate impurities to create charge. Dependent on the level of dopant in the $LiNbO_3$ this can extend the range out into the infrared, i.e. beyond the end of the visible at 700 nm, to wavelengths greater than 1000 nm. The performance may be enhanced if the wavelength is chosen to be 482.5 nm which is the wavelength at which resonant energy transfer between $Fe^{2+}$, the dopant impurity, and $Nb^{5+}$ orbitals occurs for this material. As a general rule, independent of the material, the wavelength is chosen to be within the absorption band of the substrate material to be able to adjust the absorption depth, and hence strength of frustration.

A spatially defining optical frustration pattern is formed on the surface 5 of the substrate either by focusing a Gaussian laser beam of 50 µm spot size or using an image from a test chart mask 11 relayed to the surface 5 of the substrate. Image magnification or reduction can be applied. The illuminated substrate was left for 1 hour in etchant and then removed for analysis.

Figure 2:
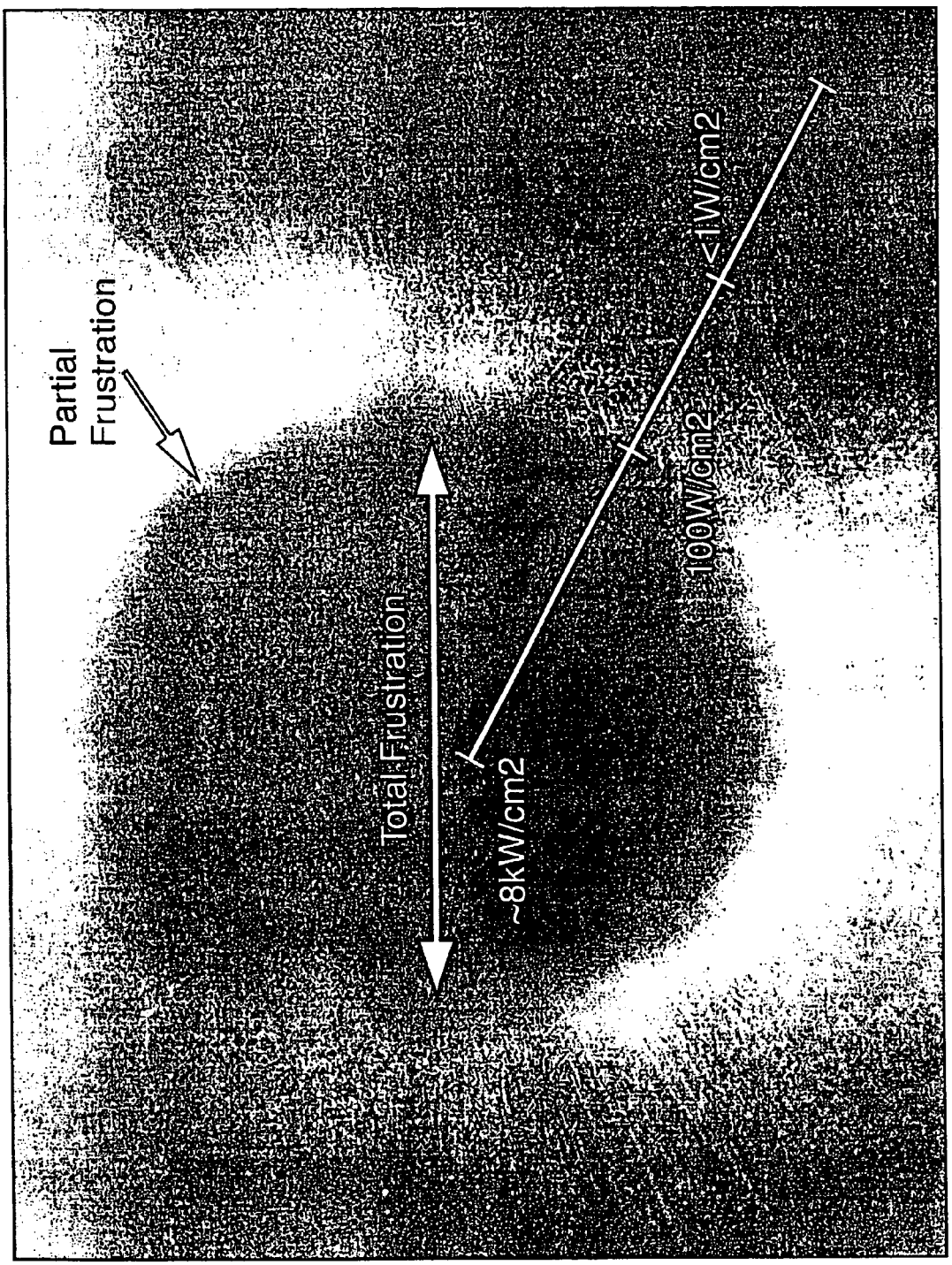
FIG. 2 is a scanning electron microscope (SEM) image of a substrate etched in accordance with the method of the present invention.

FIG. 2 is an SEM image of the substrate 1 showing that there has been total frustration of etching over a central region 14, about 100 µm in width, in which the focused laser beam light has an intensity of about 8 $kW/cm^2$, and partial frustration of etching in an area 15 further out from the centre where the intensity is about 100 $W/cm^2$. At the edge of the partially frustrated area 15, the intensity has reduced to less than 1 $W/cm^2$ and etching has taken place as normal. It can be seen from these results that a cw laser intensity of 100 $W/cm^2$ or more has a significant effect on the etching behaviour and in terms of achievable spot sizes using shorter focal length imaging lenses, this equates to very modest powers of 1 W in 1 $mm^2$, or 100 µW in an area of 10 $m^2$.

Figure 3:
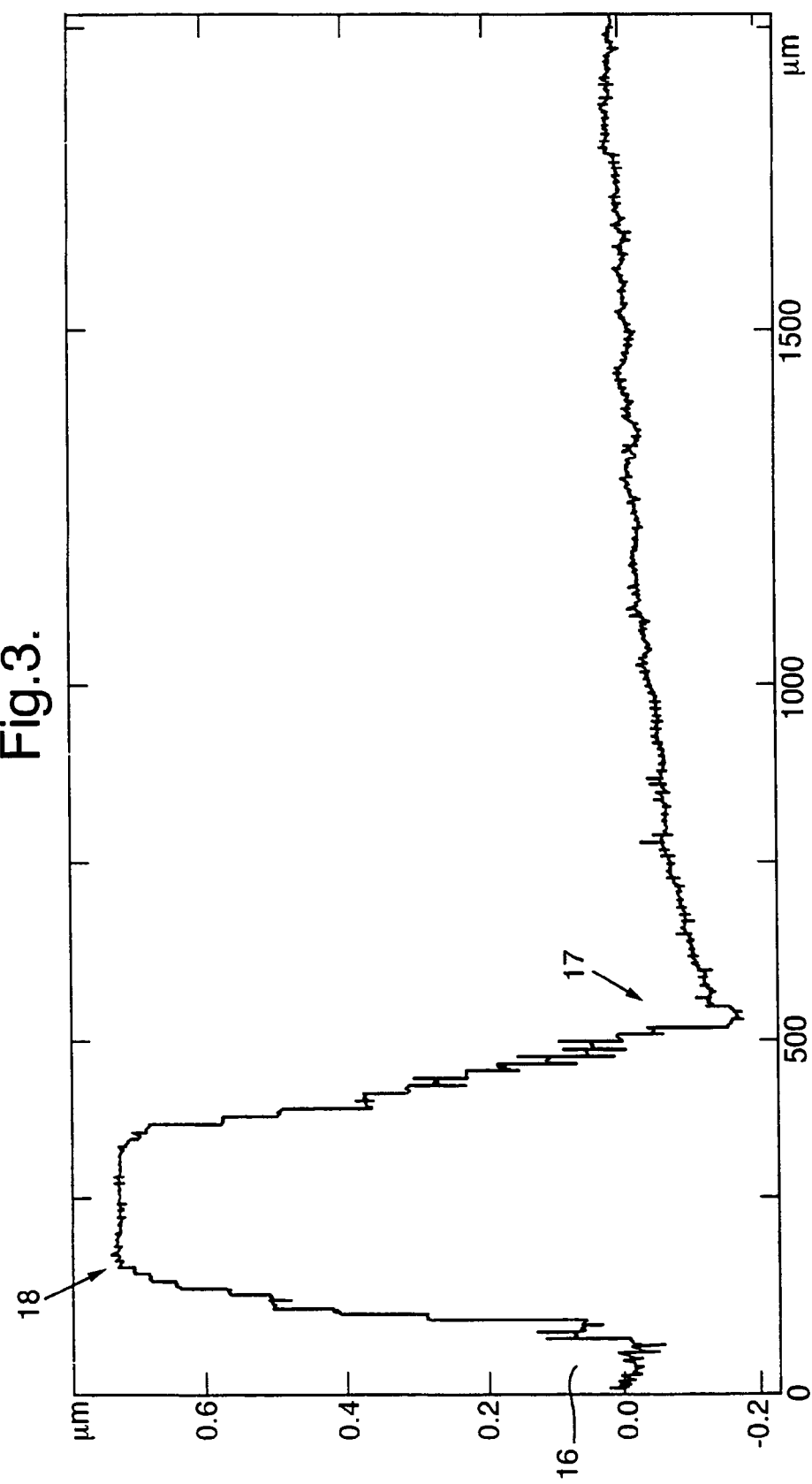
FIG. 3 illustrates variation in depth of etch with distance across the substrate for a focused spot illuminating the substrate at a wavelength of 488 nm; and, FIG. 4 shows etching of a material by a conventional method.

FIG. 3 is an alphastep trace across the surface of the substrate, indicating that the areas 16, 17 not illuminated by the $Ar^+$ laser light etched at a rate of about 0.6 µm per hour, whereas the central region 18 of the illuminated area has not been etched at all. The minor variations in the level of the trace across this region are due to unevenness in the surface of the substrate before etching and noise in the recording instruments. At distances of greater than one spot size, the light intensity has reduced to a level where etching is not completely disabled, but the etching characteristics are slowed in comparison with areas that had not been exposed at all, and etch normally.

Figure 4:
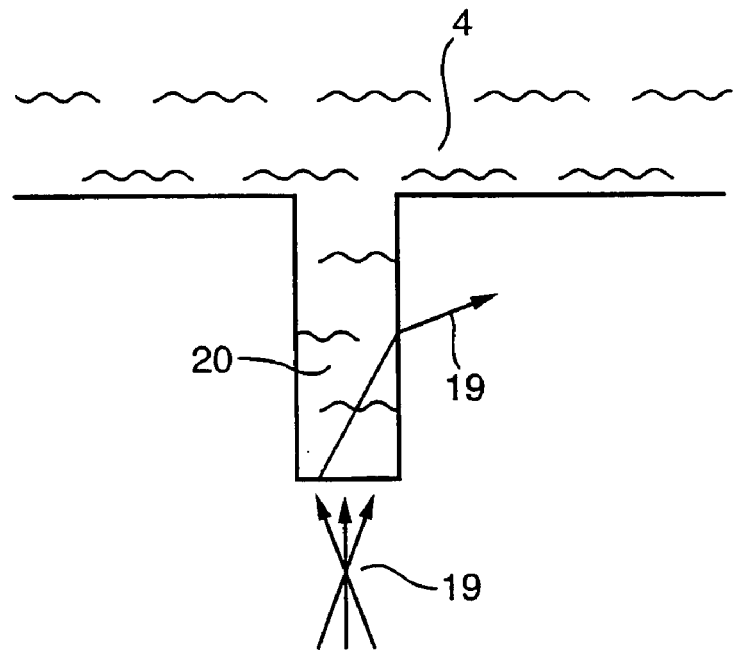
Figure 5:
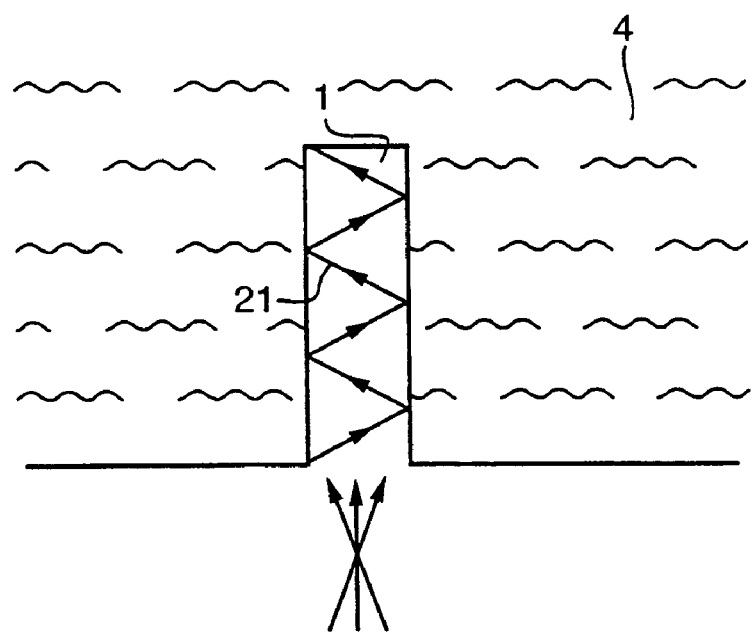
FIG. 5 shows etching of a material by the method of the present invention.

The present invention uses focused light incident from the rear of the substrate to frustrate the etching process, either wholly or partially, which has the advantage of producing a high quality image at the front face of the substrate without having to traverse an active etchant. In addition, as etching proceeds, the image plane may be progressively translated backwards, using precision translation stage control, so that the etch front and the frustration pattern coincide in the depth of the substrate. This allows arbitrarily complicated 3 dimensional structures to be realised by changing the frustration pattern during etching. A further feature of the present invention is that frustration would enable light to be guided in the substrate that remains while etching. As shown in FIG. 4, if etching takes place where light 19 is incident as in conventional methods, then as the refractive index of the substrate material is higher than that of the liquid etchant 4, light will be directed into the substrate 1 from the etched regions 20. If etching is frustrated where light 21 is incident, then light is guided within the remaining substrate as shown in FIG. 5.

Figure 6A:
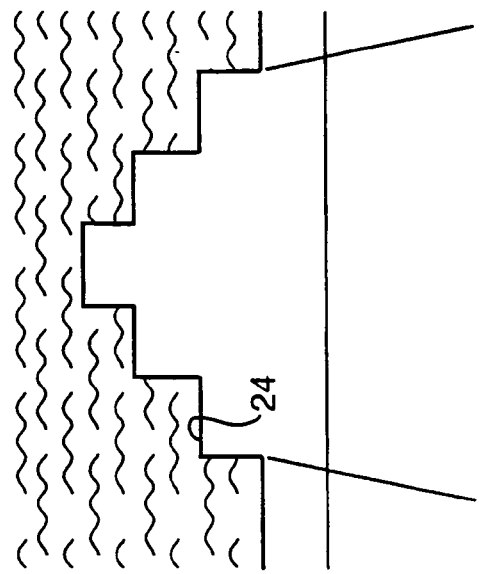
FIG. 6 illustrates creation of a 3-D structure using the method of the present invention.
Figure 6B:
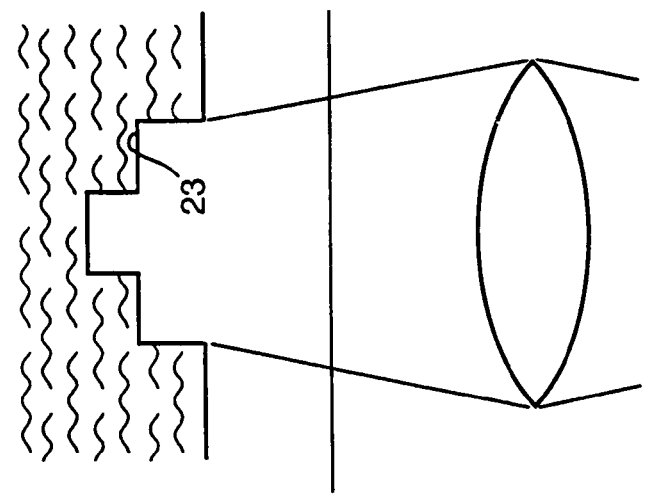
Figure 6C:
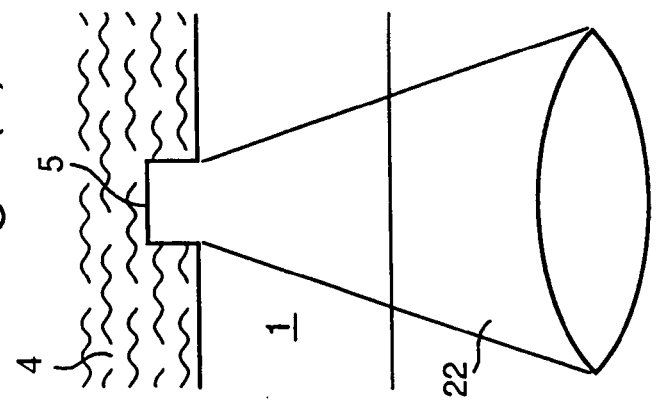

FIG. 6 illustrates how light induced frustrated etching can be used to create a substantially conical structure. Initially a light beam 22 is focused to a point at the surface 5 and etching takes place. See FIG. 6a. As etching proceeds, the focal plane is pulled back and the intensity of the light beam and the illuminated area are increased to produce a new etch front 23 shown in FIG. 6b. This is repeated, as in FIG. 6c, etch front 24, until a stepped, generally conical substrate where etching has been frustrated is produced. There is a degree of latency in the frustration effect produced at the interface of the substrate 1 and the etchant 4, so that when the plane of illumination is translated, the structure already created is not attacked by the etchant. For complex 3-D structures, the light projection could be both interferometric, as in shining on a patterned light field, or a holographic reconstruction, whereby the pattern generated is a three dimensional light field, created either from a holographic optical element, a real hologram, or a kinoform, a 3-D micromachined structure with very fine resolution, for diffracting light in any prescribed way. The hologram is positioned just below the substrate to be etched, and the pattern produced is within the substrate material.

The method of the present invention is applicable to any material whose electrical properties can be changed under the action of light. This includes materials which are photorefractive, photoconductive, photoelectric and photovoltaic, among others. The mechanism by which the frustrated etching occurs is considered to be the result of charge (electrons or holes) being liberated in the material when light at an appropriate wavelength is incident during etching. The charge migrates to accumulate at the surface where the substrate and etchant are in contact and alter the chemistry of the etching process. $LiNbO_3$ crystal is photovoltaic, so there is a preferential direction of migration which is towards the +z face of the crystal, so the substrate 1 is oriented in the cell 2 with the +z face in contact with the etchant 4, but not all materials are orientation specific. The effect does not occur in non photo-responsive materials further indicating that the light is altering the substrate, rather than the etchant.

The technique is not limited to etching of $LiNbO_3$, but is equally applicable to any material where charge can be liberated by incident light at a suitable wavelength e.g. doped semiconductors, doped glasses, ceramics, glassy ceramics, and polymers, where doping is broadly interpreted to be any impurity within the material which enables charge to be liberated. For $LiNbO_3$, dopants other than Fe can be used. Also, all commercially available $LiNbO_3$, is in fact doped, even with trace amounts of Fe, as well as other elements because of impurities which are not removed during manufacture. Even these trace amounts are sufficient to show an effect, so the doping may be one of three types, non-intentionally doped, i.e. that which occurs naturally in the 'pure' material; impurity doped, impurities which get into the material during the production process, of the order of 1 ppm; and purposefully doped, where an impurity is deliberately added, of the order of 50 ppm.

Silicon can be doped with donor elements such as phosphorus, arsenic, and antimony for example, which gives the material an extra electron (making it pentavalent rather than the natural tetravalency of Si). Equally, dopants including boron, aluminium, gallium, and indium make the material deficient of one electron, (trivalent rather than tetravalent). The same applies for example to other semiconductors such as germanium. Glasses can be doped with semiconductors, ferroelectric crystals such as $LiNbO_3$, and other materials, which have nanocrystalline sizes. These produce the charge, while the glass provides the host material. Charge generating ligands, and chromophores and other charge liberating features can be added at will to polymers during the monomer stage, and these are incorporated into the polymerised whole later. An added advantage is that crystal growth ability is not required to start with. Doped polymeric materials allow greater flexibility than crystal substrates as they can be designed to optimise photocarrier generation, migration and trapping and by the method of the present invention doped polymeric materials may be used to create lasers, amplifiers, switches, modulators, waveguides and other devices from these materials.

The etchant used and its concentration and component ratios are chosen to suit the material being etched. In the examples given, $HF:HNO_3$ is used with lithium niobate, although other etchants such as weak solutions of HF only, and KOH solutions could equally be used. All these etchants are also suitable for use with gallium arsenide (GaAs), and gallium nitride (GaN).

The invention claimed is:

1. A method of selectively etching a substrate, the method comprising the steps of;
    applying etchant at a surface of the substrate; and
    illuminating an area of the surface with light from a light source, wherein the light is transmitted through the substrate to the surface and etching is at least partially inhibited by optical liberation of charge in the illuminated area of the substrate.

2. A method of etching according to claim 1, wherein the etching is substantially inhibited at the centre of the illuminated area.

3. A method of etching according to claim 1, wherein an electrical field is applied across the substrate and etchant.

4. A method of etching according to claim 1, wherein the substrate comprises a material whose electrical properties are modified under the influence of light.

5. A method of etching according to claim 4, wherein the substrate comprises one of a glass, ferroelectric or other crystal, ceramic, semiconductor or polymer.

6. A method of etching according to claim 1, wherein the substrate comprises Fe doped $LiNbO_3$.

7. A method of etching according to claim 6, wherein the etchant comprises one of hydrogen fluoride (HF), potassium hydroxide (KOH) and 2:1 hydrofluoric acid and nitric acid ($HF:HNO_3$).

8. A method of etching according to claim 1, wherein the light comprises cw laser light.

9. A method of etching according to claim 1, wherein the light has a wavelength longer than the wavelength corresponding to the band-gap of the substrate.

10. A method of etching according to claim 1, wherein the light has a wavelength in the range 300 nm to 1000 nm.

11. A method according to claim 1, further comprising translating the image plane of the illuminated area of the substrate.

12. A method according to claim 1, further comprising projecting an interferometric or holographic 3-dimensional image onto the surface, such that the etched substrate embodies the structure of the image.

13. A method according to claim 1, wherein the wavelength of the light is tuned to the absorption wavelength of the substrate.

* * * * *